United States Patent [19]
Arkin

[11] Patent Number: 5,917,834
[45] Date of Patent: Jun. 29, 1999

[54] INTEGRATED CIRCUIT TESTER HAVING MULTIPLE PERIOD GENERATORS

[75] Inventor: Brian J. Arkin, Pleasanton, Calif.

[73] Assignee: Credence Systems Corporation, Fremont, Calif.

[21] Appl. No.: 08/918,677

[22] Filed: Aug. 21, 1997

[51] Int. Cl.[6] ................................................. G01R 31/28
[52] U.S. Cl. ......................................... 371/22.1; 324/765
[58] Field of Search .............................. 371/22.1, 22.36, 371/22.6, 27.1, 27.7, 22.2, 22.35, 25.1, 27.5; 395/183.02, 183.07, 183.08, 183.15, 185.01, 183.19, 183.06, 183.13; 364/579, 489, 490; 324/763, 765

[56] References Cited

U.S. PATENT DOCUMENTS

| | | | |
|---|---|---|---|
| 5,651,014 | 7/1997 | Kobayashi | 371/27 |
| 5,682,390 | 10/1997 | Housako et al. | 371/21.3 |
| 5,689,515 | 11/1997 | Panis | 371/22.1 |
| 5,717,352 | 2/1998 | Ebiya | 327/166 |
| 5,734,662 | 3/1998 | Sato | 371/27.7 |
| 5,748,642 | 5/1998 | Lesmeister | 371/22.1 |
| 5,783,959 | 7/1998 | Yokayama | 327/292 |

*Primary Examiner*—Robert W. Beausoliel, Jr.
*Assistant Examiner*—Nadeem Iqbal
*Attorney, Agent, or Firm*—Smith-Hill and Bedell

[57] ABSTRACT

An integrated circuit tester includes a pattern generator, a main and an auxiliary period generator, and set of tester channels, one for each terminal of an integrated circuit device under test (DUT). A test is organized into a succession of main test cycles, each divided into two or more auxiliary test cycles. The main period generator indicates the start of each main test cycle and the auxiliary period generator indicates the start of each auxiliary test cycle. Each tester channel is programmed to respond either to the main period generator or to the auxiliary period generator. At the start of each main test cycle, the pattern generator supplies data to each tester channel indicating a test activity to be carried out at the DUT terminal and indicated a time relative to a start of a test cycle at which the activity is to be carried out. Each tester channel programmed to respond to the main period generator carries out the indicated test activity once at the indicated time during the main test cycle. Each tester channel programmed to respond to the auxiliary period generator repeats the indicated test activity at the indicated time during each successive auxiliary test cycle spanned by the main test cycle.

15 Claims, 7 Drawing Sheets

INTEGRATED CIRCUIT TESTER HAVING MULTIPLE PERIOD GENERATORS

BACKGROUND OF THE INVENTION

1. Field of the Invention

The present invention relates in general to integrated circuit (IC) testers and in particular to an IC tester having a multiple period generators.

2. Description of Related Art

A typical per-pin integrated circuit tester includes a pattern generator and a set of tester channels, one for each pin of an integrated circuit device under test (DUT). The tester organizes a test into a set of successive test cycles, and during each test cycle each channel carries out a test activity at a corresponding DUT pin. Test activities may include supplying a test signal to the DUT pin or monitoring a DUT output signal produced at the pin. Before the start of each test cycle the pattern generator supplied data to each channel indicating the test activity to be carried out during the test cycle. In prior art test systems, the length of a test cycle is the same for all channels. However in some tests, test activities may occur at some pins at a higher frequency than others. For example a given DUT may have several pins which could be tested at one frequency but may require an input clock signal having twice that frequency. Since the test cycle must be the same for all channels, the test must be carried out at the higher frequency. Thus the pattern generator must produce channel input data at twice the frequency needed for all the lower frequency channels. This increases the amount of data that the pattern generator must store and thus increases tester programming time and limits maximum test length.

What is needed is an integrated circuit tester which allows test to be carried out with tester periods that may vary from channel-to-channel and from time-to-time during a test.

SUMMARY OF THE INVENTION

An integrated circuit tester in accordance with the present invention includes a pattern generator, a main and an auxiliary period generator and a plurality of tester channels, one for each pin of an integrated circuit device under test (DUT). The tester organizes a test into a set of successive main test cycles, and each main test cycle is divided into two or more auxiliary test cycles. During the test, main period generator signals the start of each main test cycle and the auxiliary period generator signals the start of each auxiliary test cycle. Before a test, each tester channel is supplied input control data indicating whether the channel is to respond to the indicating signals produced by the main or auxiliary period generator. Thereafter, before the start of each main test cycle the pattern generator supplies data to each channel indicating the test activity to be carried out. Each tester channel responding to the main period indicting signals carries out the test activity indicated by its input pattern data once during the main period. Each tester channel responding to the auxiliary period indicting signals repeats out test activity indicated by its input pattern data once during each auxiliary test cycle spanned by the main period.

Thus, for example, when tester channel that is to supply a DUT pin with a high frequency clock signal having a frequency that is four times higher than the frequency at which the other pins of the DUT are to be tested, the auxiliary period generator is programmed to indicate an auxiliary period that is one fourth that of the main period. The tester channel that is to produce the high frequency clock signal is programmed to respond to the output of the auxiliary period generator while the other tester channels are programmed to respond to the output of the main period generator. Even though the pattern generator thereafter provides input data to all tester channels at the lower frequency of the main period generator, the tester channel operating at the auxiliary period frequency will supply a clock signal at the higher frequency.

Prior to each test cycle, the pattern generator also supplies data to the main and auxiliary period generators which indicates the length main or auxiliary cycle period. Thus the test cycle period can change from time-to-time during a test. This allows various portions of a test to be carried out at differing frequencies and minimizes the amount of data that the pattern generator must provide during the test.

It is accordingly an object of the invention to provide an integrated circuit tester which allows test to be carried out with tester periods that may vary from channel-to-channel.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

DESCRIPTION OF THE PREFERRED EMBODIMENT(S)

Figure 1:
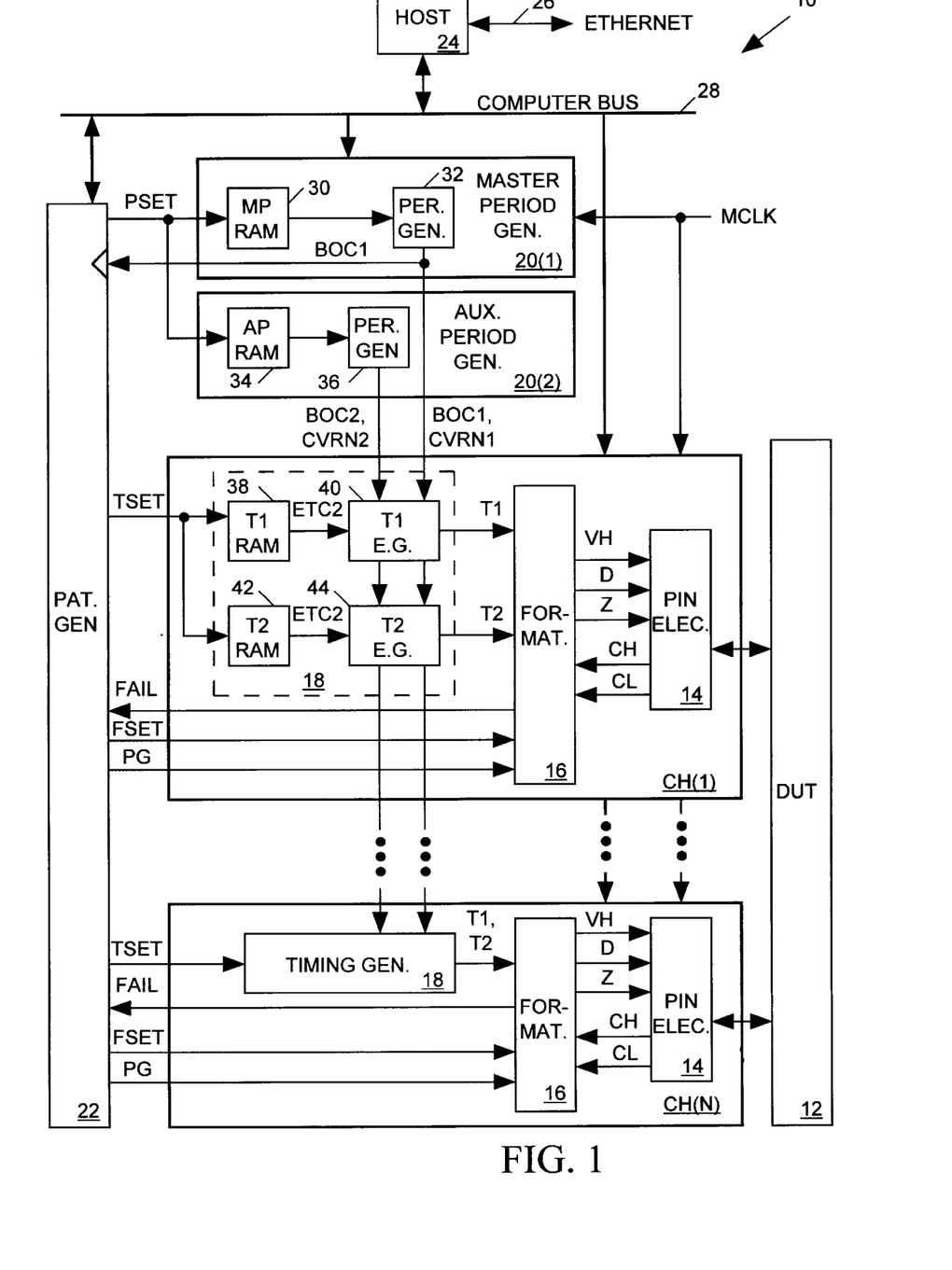
FIG. 1 illustrates an integrated circuit tester in accordance with the present invention.

FIG. 1 illustrates an integrated circuit tester 10 in accordance with the present invention for performing a test of an integrated circuit device under test (DUT) 12. Tester 10 includes a set of N channels CH(1)-CH(N), one for each pin or terminal of DUT 12. A test is organized into a succession of main test cycles, each main test cycle being evenly divided by two or more auxiliary test cycles. Each channel CH(1)-CH(N) includes a pin electronics circuit 14 for transmitting a test signal to the DUT terminal selectively during each main test cycle or during each auxiliary test cycle in response to an input pattern of control signals D, Z and VH. The D control signal tells the pin electronics circuit 14 whether to drive its output test signal to a high or low logic level. The VH signal tells the pin electronics circuit 14 whether to drive its output signal to a secondary voltage. The Z control signal tells the pin electronics circuit 14 when to tristate its output test signal. During each main or auxiliary test cycle, each pin electronics circuit 14 also compares the voltage level of a DUT output signal, if any, at the DUT terminal to predetermined high and low logic levels. Each pin electronics circuit 14 asserts a compare high (CH) signal when the signal level at the DUT terminal exceeds a minimum high logic level and asserts a compare low (CL) signal when the DUT terminal signal level does not exceed a maximum low logic level.

Each channel CH(1)-CH(N) also includes a formatter circuit 16 for supplying the D, VH and Z control signal pattern to the channel's pin electronics circuit 14 during each main or auxiliary test cycle. Each formatter 16 may also monitor the CH and CL signal outputs of pin electronics circuit 14 during each main or auxiliary test cycle to determine whether a DUT 12 output signal (if any) at the terminal matches its expected state. Each formatter 16 produces an output FAIL signal when the DUT output signal fails to match its expected state.

Each channel CH(1)-CH(N) includes an edge timing generator 18 for generating and transmitting to the channel's formatter 16 a pair of timing signals T1 and T2. The state of each timing signal T1,T2 may change once at any time during each main or auxiliary test cycle. Formatter 16 uses the edges of timing signals T1 and T2 as timing references when driving its output signals D, VH and Z signals high or low and when comparing the CH and CL signals to their expected states. Tester 10 also includes two cycle period generator 20(1) and 20(2) for providing a set of main and auxiliary period indicating signals BOC1/CVRN1 and BOC2/CVRN2 separately to all timing generators 18. The BOC1/CVRN1 indicting signals tell the timing generators 18 when each main test cycle starts while the BOC2/CVRN2 indicating signals tell the timing generators when each auxiliary test cycle starts.

A pattern generator 22 provides input data to period generator 20, timing generators 18 and formatters 16 for each main test cycle. A 5-bit "PSET" data value tells period generators 20(1) and 20(2) how long the main or auxiliary test cycle is to last. A 5-bit TSET pattern generator data output supplied separately to each timing generator 18 indicates times during the main or auxiliary test cycle each timing generator 18 is to produce edges in its T1 and T2 output signals. A 5-bit FSET pattern generator data output supplied separately to each formatter 16 and a 2-bit PG pattern generator data output supplied in common to all formatters 16 together tell formatter 16 the states to which it is to drive its output signals D, VH, and Z in response to T1 and T2 signal pulses. During the test, pattern generator 22 also receives, stores and processes FAIL data produced by formatters 16.

To define a test to be performed, input programming data is supplied to a conventional host computer 24 via an Ethernet bus 26. Host computer 24 distributes the programming data via a conventional computer bus 28 to various control registers and memories within pattern generator 22, period generator 20, timing generators 18, formatters 16 and pin electronics circuits 14. The programming data supplied to pattern generator 22 tells the pattern generator how to produce its output pattern of PSET, TSET, FSET and PB data for each test cycle and how to respond to input FAIL signals. The programming data supplied to period generators 20(1) and 20(2) indicates a particular main or auxiliary cycle period length for each possible value of PSET. The programming data supplied to timing generators 18 correlates a particular T1,T2 timing signal edge pattern to each possible value of TSET. The programming data supplied to each formatter 16 tells it how to respond its various combinations of input pattern data FSET, PG and timing signals T1, T2 so as to produce particular patterns of output signals D,VH and Z. Finally programming data supplied to pin electronics circuits 14 indicates their compare high and low logic levels and their supply voltage levels.

Period Generators

The main period generator 20(1) includes a main cycle period (MP) RAM 30 and a period generator 32. When, during each cycle of the test, pattern generator 22 produces it 5-bit PSET data value output, that PSET data value address MP RAM 30. Pre-loaded with programming data from host 24, MP RAM 30 acts as a lookup table, translating the PSET value into data indicting a main cycle period length and supplying that data to period generator 32. Period generator 32, employing a master clock signal MCLK as a timing reference, produces a "beginning of cycle" signal BOC1 indicating a next MCLK pulse after which a next main test cycle is to begin. Period generator 32 also produces a "residue" data value (CVRN1) indicating how long after that next MCLK signal pulse the main test cycle actually begins. The BOC1 and CVRN1 data are supplied to the timing generators 18 to tell them when the next main cycle begins. Period generator 32 also supplies the BOC1 to pattern generator 22 to indicate when the pattern generator is to produce an output data pattern for a next test cycle.

Auxiliary period generator 20(2) includes an alternate cycle period (AP) RAM 34 and an AP edge generator 36, RAM 34 also receiving the same PSET data value from pattern generator 22 and producing a second set of period signals BOC2, CVRN2 indicating the start and length of an alternate cycle period. An alternate cycle period must be shorter than the current main cycle period and must evenly divide into the main cycle period so that a selected integer number of alternate cycles may occur during a main cycle. The alternate period indicating signals BOC2/CVRN2 are also supplied to each timing generator 18. Each timing generator 18 is supplied with control data from host 24 before the start of the test telling the timing generator whether to use the main or the alternate period signals.

Timing Generators

Each timing generator 18 includes a RAM 38 and an edge generator 40 for producing its output T1 timing signal. RAM 38, addressed by the TSET data output of pattern generator 22 and pre-loaded with programming data from host 24 before the start of the test, converts each value of TSET to corresponding edge timing control data (ETC1) supplied as input to edge generator 40. Host 24 supplies control data to edge generator 40 before the start of the test to indicate whether edge generator 40 is to respond to the BOC1/CVRN1 main period indicating signals or to the BOC2/CVRN2 alternate period indicating signals. When the selected BOC1 or BOC2 signal is high, edge generator 40 waits for the next MCLK signal pulse. After detecting the MCLK pulse, edge generator 40 waits for an additional portion of a MCLK clock cycle as indicated by the selected CVRN1/CVRN2 data. At that point edge generator 40 assumes that a new main or auxiliary test cycle has begun. The ETC1 data input from RAM 38 indicates when during the next main cycle, edge generator 40 is to generate a T1 signal pulse.

Each timing generator 18 also includes a RAM 42 and an edge generator 44 that are identical to and operate in the same manner as RAM 38 and edge generator 40 to produce the T2 timing signal. While RAMS 38 and 42 receive the same TSET values, the two RAMS typically store different programming data so that they supply different edge timing control data ETC1 and ETC2 to their respective edge generators 40 and 44 in response to the same TSET value. Thus one TSET value can specify different edge timing for the T1 and T2 signal edges.

Edge Generator

Figure 2:
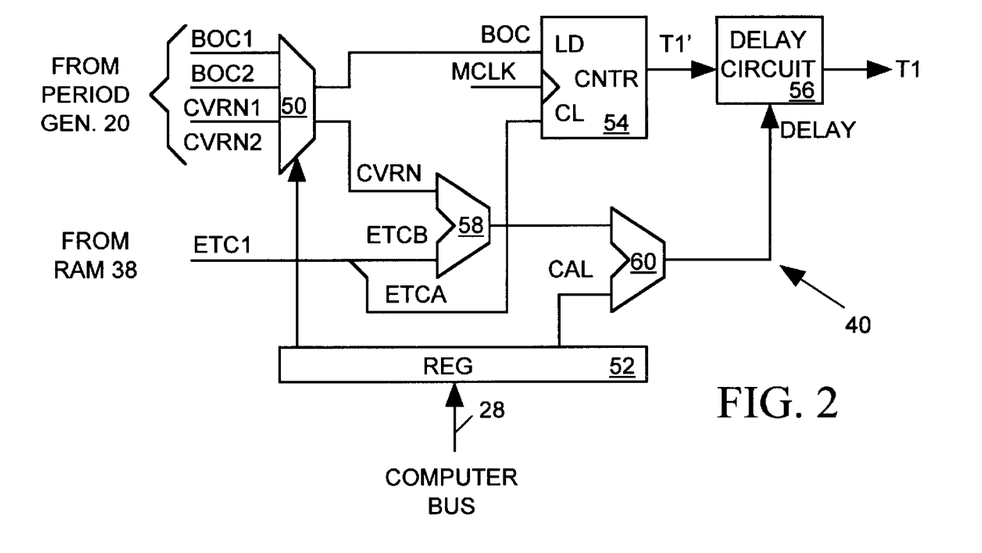
FIG. 2, illustrates a typical edge generator of FIG. 1 in more detailed block diagram form.

FIG. 2 illustrates edge generator 40 of FIG. 1 in more detailed block diagram. Edge generator 44 is similar. Referring to FIG. 2, edge generator 40 includes a multiplexer 50 controlled by control data stored in a register 52 for selecting either the main BOC1/CVRN1 period data or the alternate BOC2/CVRN period data. The host 24 of FIG. 1 loads register 52 with selection control data via computer bus 28 before the start of the test. The selected one of the BOC1/BOC2 signals (BOC) and the master clock signal MCLK are supplied to a counter 54 clocked by the MCLK signal. Counter 54 loads a portion (ETCA) of the ETC1 data from RAM 38 of FIG. 1 when input enabled by the BOC output of multiplexer 50. Thereafter, counter 54 counts to a count limit indicted by the ETCA data and then produces an output signal T1'. A programmable delay circuit 56 delays the T1' signal with a delay determined by input data DELAY. A pair of adders 58 and 60 add the selected CVRN output of multiplexer 50 and a calibration data value CAL stored in register 52 to another portion (ETCB) of the edge timing control data ETC1 output of RAM 38 of FIG. 1 to produce the DELAY data value. The calibration data CAL is separately adjusted for each channel to calibrate out differences in delay between a state change in MCLK and a resulting state change in the test signal arriving at the DUT terminal.

Edge generator produces a T1 signal pulse during each test cycle. The selected BOC signal indicates that the next test cycle begins at some point after the next MCLK pulse. The CVRN data indicates how long after that MCLK pulse that the next test cycle actually begins. The ETCA value indicates how many MCLK cycles counter 54 is to wait following the start of the next test cycle before generating a T1' pulse. The ETCB data indicates the amount of time delay circuit 56 is to delay the T1' signal in order to produce a T1 signal pulse. The adjustable delay of delay circuit 56 ranges from 0–1 MCLK period.

Formatter

Figure 3:
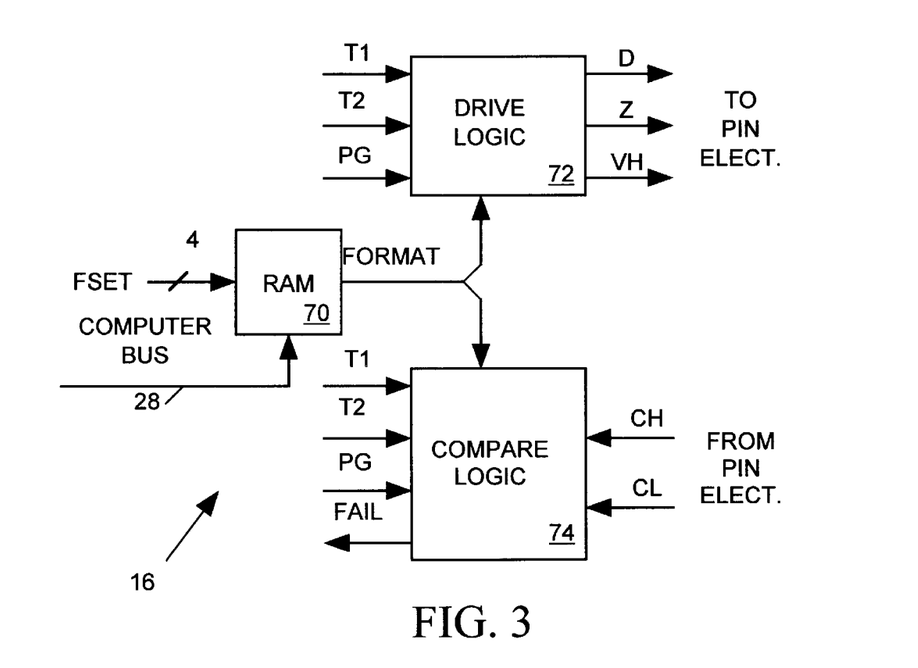
FIG. 3 illustrates a typical formatter of FIG. 1 in more detailed block diagram form.

FIG. 3 illustrates a typical formatter 16 of FIG. 1 in more detailed block diagram form. Referring to FIG. 3, formatter 16 receives a 4-bit FSET data value from pattern generator 22 for each main test cycle. The FSET data indicates a particular test format to be carried out by a tester channel at the DUT terminal during the test cycle. The 4-bit FSET data value addresses a RAM 70, having 16 storage locations, one for each value of the FSET data. Before the test begins, the host computer 24 of FIG. 1 stores format control data (FORMAT) in each storage location of RAM 70 via computer bus 28. Although each channel is capable of executing a large number of different types of test formats, the FSET data value supplied to the formatter 16 has only four bits and can only take on 16 different values. Thus the FSET data value can only represent 16 of the large number of different test formats the formatter can produce. The data stored in the 16 storage locations of RAM 70 of the formatter 16 of each tester channel determines which 16 of the many possible test formats the channel will be able to perform during the test. Although the formatter can provide only 16 different formats during a test, this is not a significant limitation on tester capability since tests normally require fewer than 16 different test formats at any one DUT terminal. Since the RAMs 70 of the formatter 16 of each tester channel may receive different programming data from host 24 of FIG. 1, the tester channels do not all have to be programmed for the same 16 test formats.

During the test, when an incoming FSET data value addresses RAM 70, RAM 70 reads out a portion of the addressed FORMAT data to a drive logic circuit 72 and reads out another portion of the addressed FORMAT data to a compare logic circuit 74. The drive logic circuit 72 also receives the T1 and T2 timing signals from the timing generator 18 of FIG. 1 and the pattern data bits PG from pattern generator 22. Drive logic circuit 72 supplies the output D, Z and VH signals to pin electronics circuit 14, with the particular sequence of state changes in the D,Z and VH signals being controlled by the FORMAT and PG data values and with the timing of those state changes being controlled by the T1 and T2 timing signals. The compare logic circuit 74 also receives the T1 and T2 timing signals and PG data as well as the compare high (CH) and compare low (CL) output signals of pin electronics circuit 14 of FIG. 1. The compare logic circuit 74 compares the CH and/or CL signals to expected states and asserts the FAIL signal when the CH and CL signal states are not as expected during a test cycle. The FORMAT data controls the manner (format) in which compare logic circuit 74 carries out the comparison and the T1 and T2 signals are used to control the timing of the comparison. In some compare formats the two-bit PG data indicates expected states CH and CL signal states. In other formats, the expected states are specified by the format itself and are independent of the PG data.

Drive Logic

Figure 4:
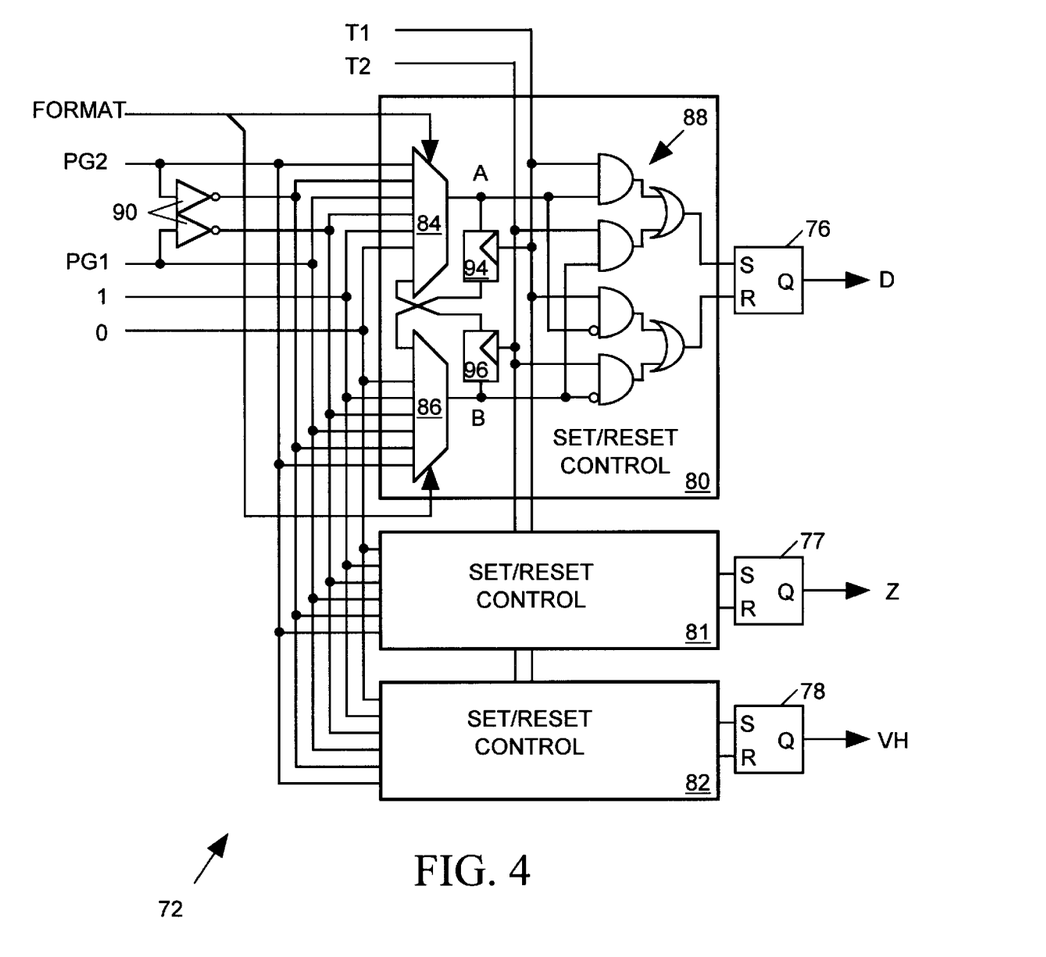
FIG. 4 illustrates the drive logic circuit of FIG. 3 in more detailed block diagram form.

FIG. 4 illustrates the drive logic circuit 72 of FIG. 3 in more detailed block diagram form. Drive logic circuit 72 includes a set of three S-R flip-flops 76, 77 and 78 for respectively producing the D, Z and VH drive signals supplied to the pin electronics circuit 14 of FIG. 1. A separate control circuit 80–82 controls the set and reset inputs of each flip flop 76–78. Set/reset control circuit 80 includes a pair of multiplexers 84 and 86, each controlled by a separate portion of the FORMAT data from RAM 70 of FIG. 3. Multiplexer 84 selects from among 7 input data signals to provide an input A to a logic circuit 88. Multiplexer 86 also selects from among 7 input data signals to provide an input B to logic circuit 88. Multiplexer 84 receives as inputs the two PH bits (PG1 and PG2) from the pattern generator 22 of FIG. 1, hard wired high and low logic levels ("0", and "1"), and the B output of multiplexer 86 delayed one test cycle by a latch 96 clocked by T2. Multiplexer 84 also receives the PG1 and PG2 bits inverted by inverters 90. Multiplexer 86 receives as inputs the inverted and non-inverted PG bits (PG1 and PG2), the hardwired high and low logic levels, and the A output of multiplexer 84 delayed one test cycle by a latch 94 clocked by T1.

Logic circuit 88 receives the A and B signal outputs of multiplexers 84 and 86 as well as T1 and T2 signals. The T1 signal enables signal A and allows it to either set or reset flip-flop 76, depending on the state of the A signal when T1 is asserted. Similarly the T2 signal enables signal B and allows it to either set or reset flip-flop 76. Thus the T1 and T2 control the timing of the edges of the drive signal D supplied to the pin electronics circuit, while the FORMAT data values selects a data source for controlling the state to which the drive signal changes. Set/reset control circuits 81 and 82 are similar to circuit 80. Thus, as may be seen from FIG. 4, the FORMAT data input to drive logic circuit 72 selects one of 7 input sources to control controlling state changes in each output signal D, VH and Z and selects the T1 and/or the T2 signal as a reference for timing those state changes.

Each of T1 and T2 signals can have only one pulse during each main or auxiliary test cycle depending on whether the timing edge generator that produced them has been programmed for main or auxiliary period operation. Thus the driver circuit 72 output signals D, Z and VH can have only up to two edges during each main or auxiliary test cycle depending on the mode of operation of the timing edge generator. The PG1/PG2 and FORMAT data input to driver 72 can change only at the beginning of each main period even though the T1 and T2 signal inputs may be operating at a higher auxiliary test frequency. In such case the D, Z and VH output signal patterns repeat during successive auxiliary test cycles until the main test cycle ends and the PG and FORMAT data and/or T1,T2 signal timing can change.

Compare Logic

Figure 5:
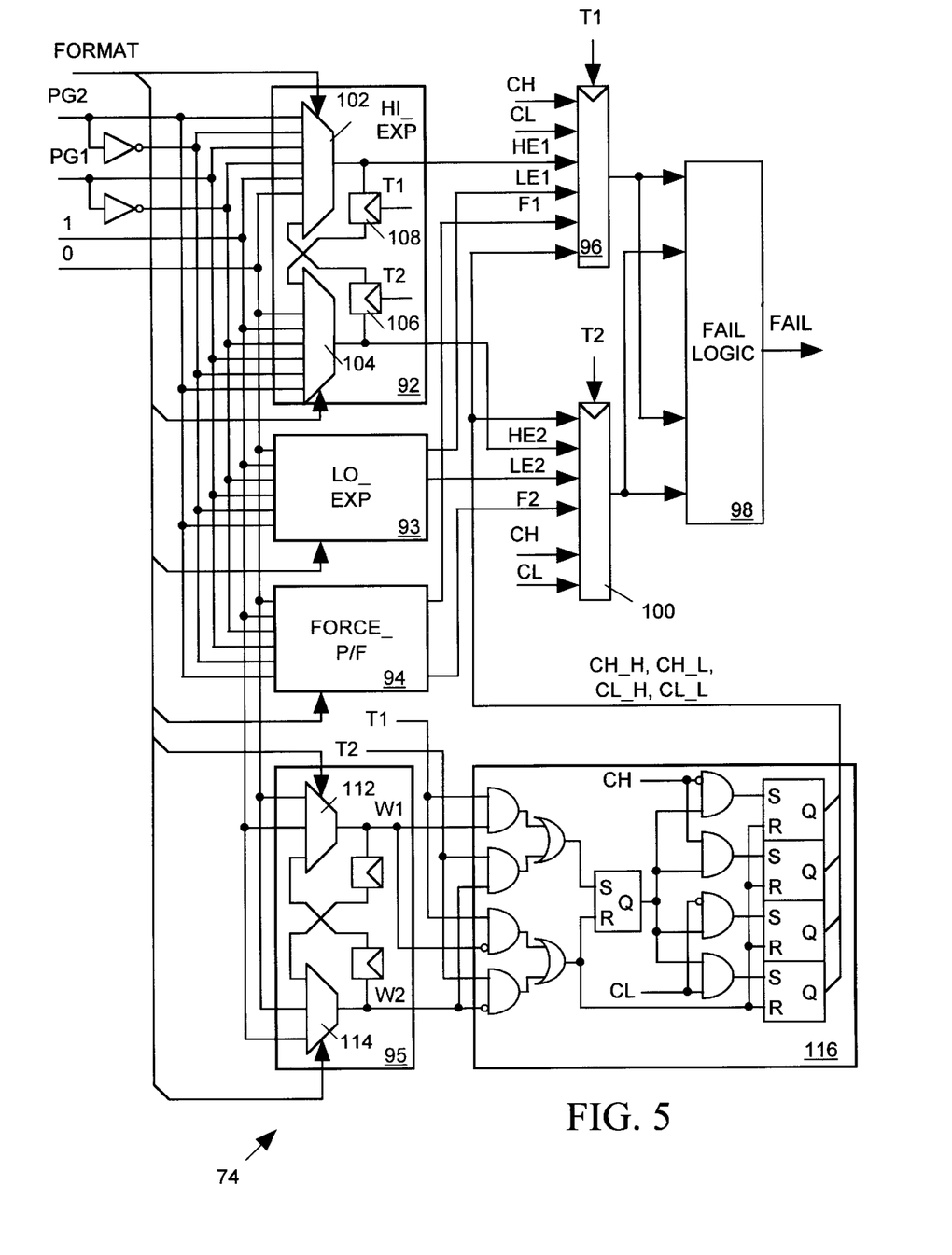
FIG. 5 illustrates the compare logic circuit of FIG. 3 in more detailed block diagram form.

FIG. 5 illustrates the compare logic circuit 74 of FIG. 3 in more detailed block diagram form. Compare logic circuit 74 includes a set of four "expect data selection" circuits 92–95. A high expect data selection circuit 92 produces two output signals HE1 and HE2 during each main or auxiliary test cycle. The HE1 signal is asserted when the DUT output is expected to be logically high on a rising edge of the T1 timing signal. The T1 signal clocks the HE1 signal and the compare high signal CH from the pin electronics circuit through a latch 96 to a fail logic circuit 98. If the DUT is working properly, then when the DUT output signal is expected to be a logical "1" on the T1 signal edge, both CH and HE1 should be high. If the CH input to fail logic circuit 98 is low when HE1 is high, then the DUT output is in error and fail logic circuit 98 will assert the FAIL signal. The HE2 signal is asserted during a test cycle when the DUT output is expected to be logically high on a rising edge of the T2 timing signal. The T2 signal clocks the HE2 signal and the CH signal through a latch 100 to fail logic circuit 98. Fail logic circuit asserts the FAIL signal whenever HE2 goes high by CH does not.

High expect data selection circuit 92 includes a pair of multiplexers 102 and 104 for producing the HE1 and HE2 signals, each multiplexer being controlled by separate portions of the FORMAT data from the formatter RAM 70 of FIG. 3. Multiplexer 102 produces the HE1 signal by selecting one of seven inputs including non-inverted and inverted PG1 and PG2 bits, hardwired logical 0 and logical 1 bits, and the HE2 signal output of multiplexer 104 delayed one test cycle by a latch 106. Multiplexer 104 also produces the HE2 signal by selecting one of seven inputs including non-inverted and inverted PG1 and PG2 bits, hardwired logical 0 and logical 1 bits, and the HE1 signal output of multiplexer 102 delayed one test cycle by a latch 108. Thus the FORMAT data selects the source of data indicating the expected state of the compare high CH output of the pin electronics circuit and also determines whether the expected output is to be sampled on the T1 or T2 timing signal edge.

A low expect data selection circuit 93, force pass/fail expect data selection circuit 94 and window mode enable selection circuit 95 are similar to high expect circuit 92 but are controlled by separate portions of the FORMAT data. The low expect circuit asserts a low expect signal LE1 or LE2 to indicate when the DUT output signal is to be logically low on the edge of either the T1 or T2 timing signal. These signals, along with the compare low data CL from the pin electronics circuits are also latched by latches 96 and 100 onto input of FAIL logic circuit 98. Fail logic circuit asserts the FAIL signal when either LE1 or LE2 is high but its corresponding CL input is low. The force fail circuit 94 asserts an F1 or an F2 signal to force the fail logic circuit to assert the FAIL signal on an edge of the T1 or T2 timing signal. The F1 and F2 signals also pass through latches 96 and 100, respectively, to inputs of the force logic circuit.

In a "window expect mode" of operation, the DUT is expected to produce a constant high, low or tristate output signal during a window of time between any two T1 and T2 timing edges and not to "glitch" to an incorrect state during the time window. A window mode enable circuit 95 asserts a signal W1 to indicate that the window is to open on the T1 edge and to close on the T2 edge and asserts a signal W2 to indicate the window is to open on the T2 edge and close on the T1 edge. A logic circuit 116 receives the T1, T2, CH, CL, W1 and W2 signals and produces a set of four output indicating signals that pass through latches 96 and 100 to fail circuit 98. A CH__H signal indicates whether the CH signal went high at some point during the time window and a CH__L signal indicates whether the CH signal transitioned low at some point during the time window. A CL__H signal indicates whether the CL signal went high at some point during the time window and a CH__L signal indicates whether the CH signal went low at some point during the window. Latches 96 and 100 supply these signals to fail logic circuit 98 at the end of the window on the T1 and T2 edges. If two any of these indicating signals are asserted, fail circuit 98 will assert the FAIL signal thus indicating that the DUT output signal went through an unexpected state transition during the window. Fail circuit 98 responds by asserting the FAIL signal.

Each of T1 and T2 signals can have only one pulse during each main or auxiliary test cycle depending on whether the timing edge generator that produced them has been programmed for main or auxiliary period operation. Thus the compare logic 74 can check for a FAIL condition only once every main or auxiliary test cycle depending on the mode of operation of the timing edge generator. The PG1/PG2 and FORMAT data input to compare logic 74 can change only at the beginning of each main period even though the T1 and T2 signal inputs may be operating at a higher auxiliary test frequency. In such case compare logic repeats the same fail test repeat during successive auxiliary test cycles until the main test cycle ends and the PG and FORMAT data and/or T1,T2 signal timing can change.

Pattern Generator

Figure 6:
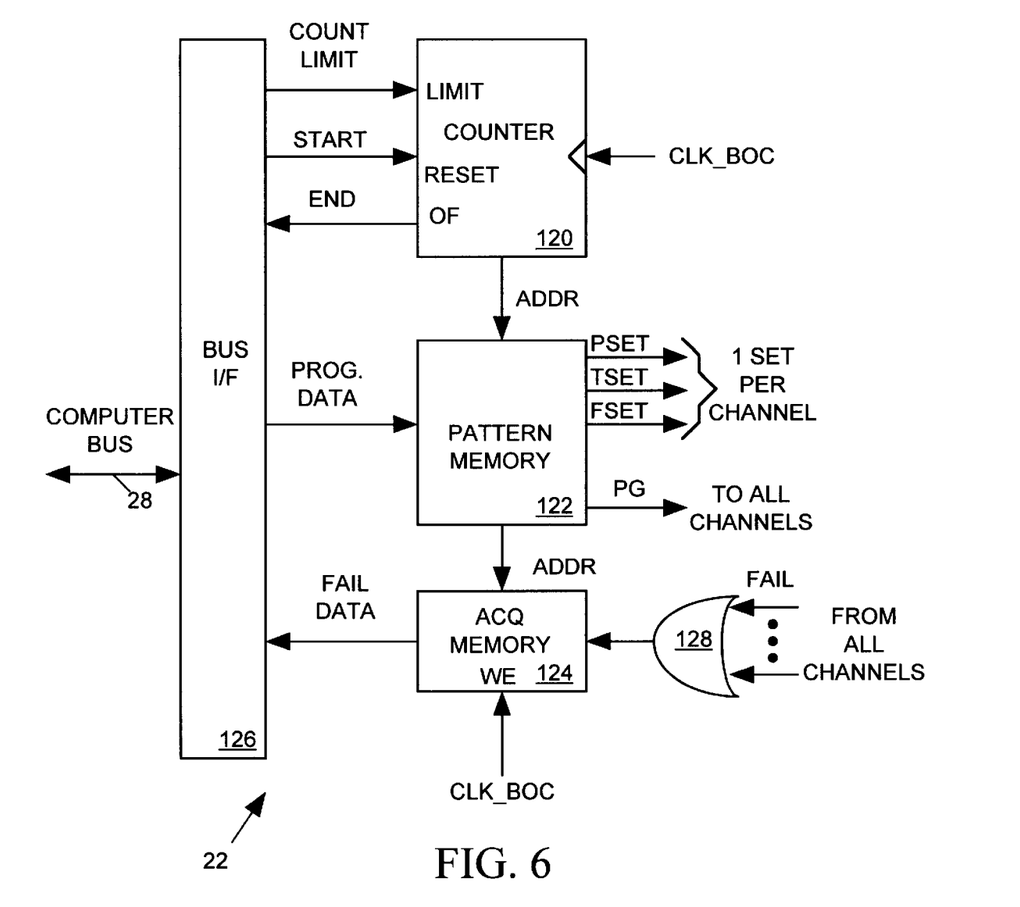
FIG. 6 depicts the pattern generator of FIG. 1 in more detailed block diagram form.

FIG. 6 depicts pattern generator 22 of FIG. 1 in more detailed block diagram form. Pattern generator 22 includes a counter 120 clocked by the BOC1 signal at the start of each main test cycle. The output count of counter 120, indicating the number of main test cycles occurring since the start of the test, address a random access pattern memory 122 and a random access acquisition memory 124. Pattern memory 122 includes an addressable storage location for each main test cycle, each storage location pre-loaded with PSET, TSET, FSET and PG pattern data from host computer 24 of FIG. 1 via computer bus 28 and a conventional bus interface circuit 126. The host also supplies a count limit value to counter 120 via bus interface 126 before the start of the test. The host computer 24 starts the test by sending a START signal to a reset input of counter 120 via bus interface 126. The START signal resets counter 120 to COUNT limit starting the test. Counter 120 resets its ADDR to 0 and then begins incrementing its output ADDR count on each pulse of the BOC1 signal. Thus before the beginning of each main test cycle, as indicated by the BOC1 signal, counter 120 increments the address input ADDR to pattern memory 122 so that it produces the appropriate output data pattern for the test cycle. At the end of the test counter 120 overflows its count limit and transmits an END signal to the host via bus interface 126 and bus 28.

During the test, an OR gate 128 ORs the FAIL signals produced by all channels to produce a single FAIL bit supplied as a data input to acquisition memory 124. Acquisition memory 124, write enabled by the BOC1 at the start of each test cycle and addressed by the ADDR output of counter 120 stores the FAIL bit at the current address. At the end of the test, the host computer can read the fail data out of acquisition memory 124 via bus 28 and interface circuit 126 to obtain the results of the test.

Multiple Auxiliary Period Generators

Figure 7:
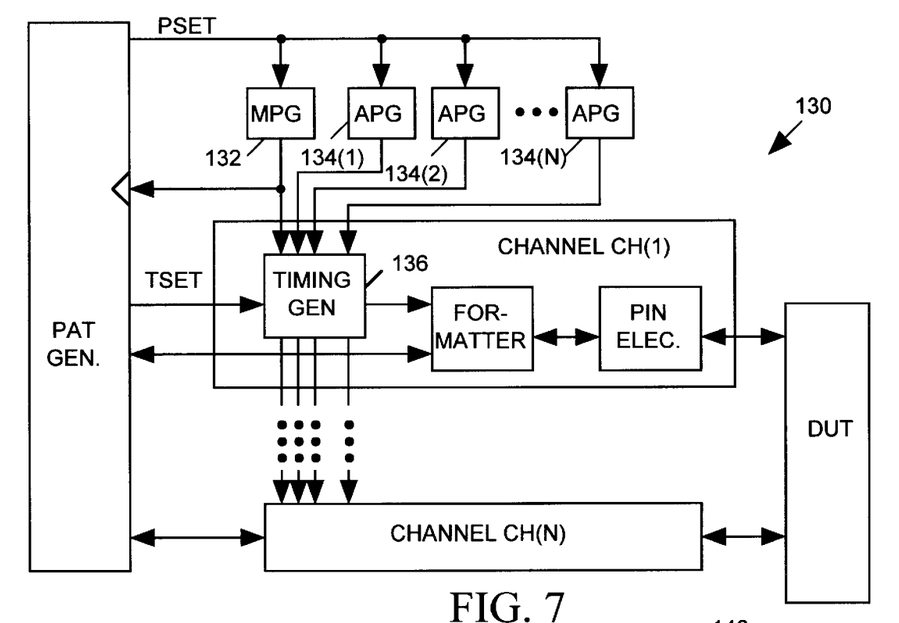
FIG. 7 illustrates a portion of an integrated circuit tester in accordance with an alternative embodiment of the invention that employs multiple auxiliary period generators.

The integrated circuit tester 10 of FIG. 1 employs a single auxiliary period generator 20(2). FIG. 7 illustrates a portion of an integrated circuit tester 130 in accordance with an alternative embodiment of the invention that is similar to tester 10 of FIG. 1 but employs a single main period generator 132 and multiple auxiliary period generators 134(1)-134(M). In tester 130 the timing generator 136 within each tester channel CH(1)-CH(N) may select from among the period data outputs of the main period generator 132 and all M auxiliary period generators 134(1)-134(M), thereby permitting the tester to employ M+1 different test cycles. The period of each auxiliary period generator 134 should be should even dividable into the period of the main period generator 132. Edge generators within timing generator 136 are similar to edge generator 40 of FIG. 2 except that multiplexer 50 of FIG. 2 is expanded to receive BOC/CVRN data from the main period generator 132 and all M auxiliary period generators 134(1)-134(M).

Auxiliary Period Generator Per Channel

Figure 8:
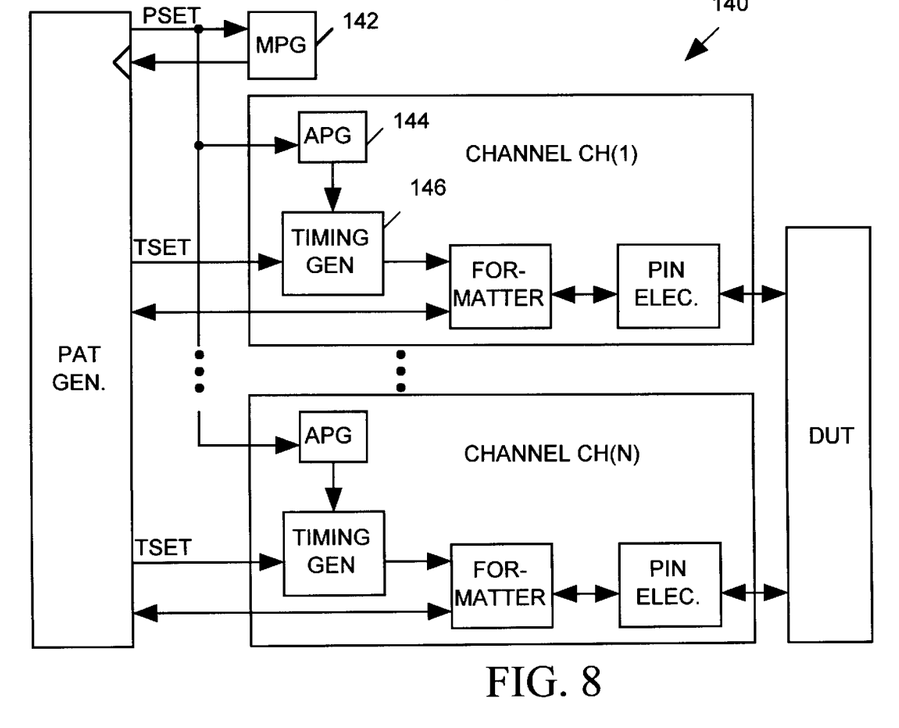
FIG. 8 illustrates portions of an integrated circuit tester in accordance with an another alternative embodiment of the invention that employs a separate auxiliary period generators for each tester channel.

FIG. 8 illustrates portions of an integrated circuit tester 140 in accordance with another alternative embodiment of the invention. Tester 140 of FIG. 8 is similar to tester 10 of FIG. 1 except that it employs a single main period generator 142 and a separate auxiliary period generator 144 for each tester channel CH(1)-CH(N). The edge generator within timing generator 146 of each channel CH(1)-CH(N) of FIG. 8 is similar to edge generator 40 of FIG. 2 except that multiplexer 50 of FIG. 2 is eliminated and the BOC and CVRN outputs of the auxiliary period generator 144 are applied directly to AND gate 54 and adder 58.

Main Period Generator Per Channel

Figure 9:
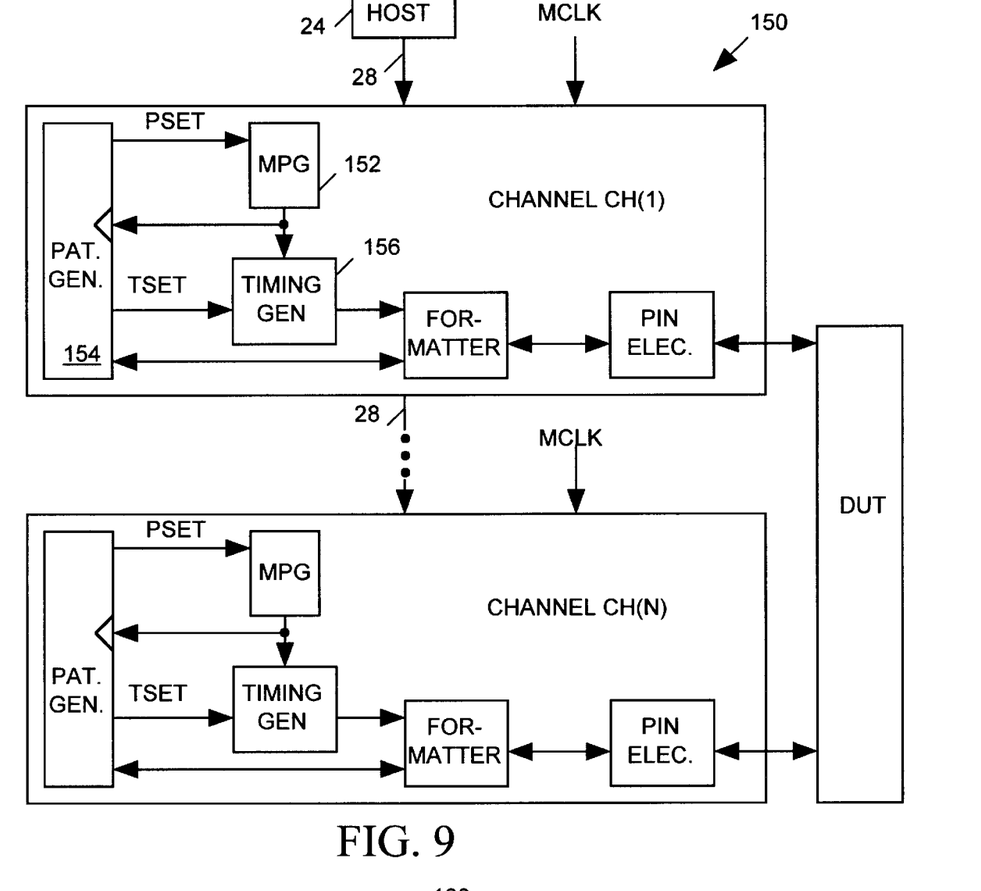
FIG. 9 illustrates an integrated circuit tester in accordance with an alternative embodiment of the invention that employs a separate pattern generator for each tester channel.

FIG. 9 illustrates an integrated circuit tester 150 in accordance with an alternative embodiment of the invention employing a separate main period generator 152 and a separate pattern generator 154 for each tester channel CH(1)-CH(N). Each pattern generator 154 is separately programmed by host 24 via computer bus 28 and runs at a frequency determined by its local main period generator 152. The timing generator 156 of each channel responds only to the output of its local period generator 152. In this architecture, the test cycle periods of the period generator 152 of all channels CH(1)-CH(N) are independently adjustable and need not have any particular relation to one another. Also each pattern generator 154 supplies a separate PSET value to its local period generator 152 at the start of each cycle so that the test cycle period for each channel can change from cycle to cycle. The test activities of the various channels CH(1)-CH(N) are nonetheless synchronized because pattern generator 154 concurrently receive the START signal from host 24 and because all channels CH(1)-CH(N) uses the same master clock signal MCLK as a timing reference.

Period Generator

Figure 10:
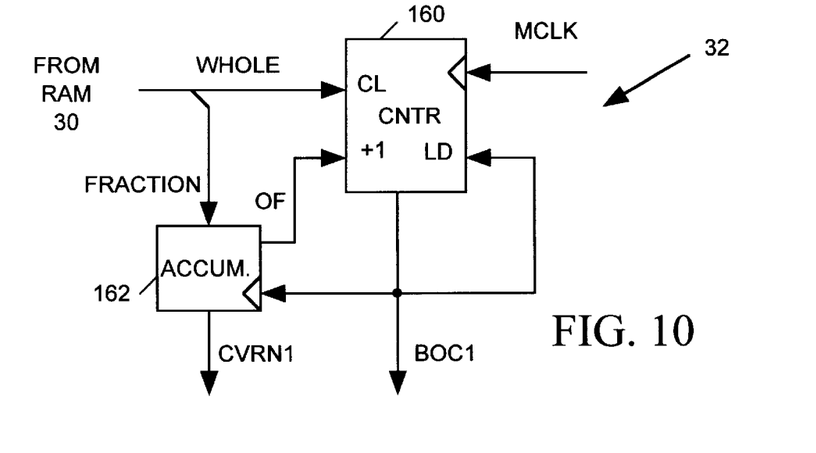
FIG. 10 illustrates period generator of FIG. 1 in more detailed block diagram form.

FIG. 10 illustrates period generator 32 of FIG. 1 in more detailed block diagram form. A main test cycle spans a whole and fractional number of master clock MCLK cycles. Referring to FIG. 10, the data output of RAM 30 of FIG. 1 includes WHOLE and a FRACTION values respectively indicating the whole and fractional portions of a main test cycle. On the trailing edge of next BOC1 signal pulse, the WHOLE data is loaded into a counter 160 and the FRACTION value is accumulated by an accumulator 162. Counter 160 then begins counting MCLK signal pulses. When its count reaches WHOLE, counter 160 generates a next BOC1 pulse. The leading edge of the BOC1 pulse tells pattern generator 22 of FIG. 1 to produce a new PSET value, thereby causing RAM 30 to produce a WHOLE/FRACTION data pair for the next test cycle. Accumulator 162 accumulates successive FRACTION data values to produce the CVRN1 data. Accumulator 162 overflows when the accumulated CVRN1 data indicates a period greater than one MCLK cycle and provides; an overflow signal OF to a +1 input of counter 160. When counter 160 next loads a WHOLE value it sets its count limit to WHOLE+1. Thus the BOC1 output of counter 160 indicates a last MCLK pulse preceding a start of a next test cycle while the CVRN1 data indicates a fractional portion of one MCLK cycle after that MCLK pulse that the next test cycle actually begins. The auxiliary period generator 36 of FIG. 1 is similar to period generator 32 of FIG. 10.

While the forgoing specification has described preferred embodiment(s) of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. A tester for carrying out test activities at each terminal of an integrated circuit device under test (DUT), the test being organized into successive main test cycles, each main test cycle spanning a plurality of auxiliary test cycles, the tester comprising:

a main period generator for generating main test cycle data indicating a beginning time of each main test cycle signal;

an auxiliary period generator for generating auxiliary test cycle data indicating a beginning time of each auxiliary test cycle;

a pattern generator for generating a plurality of timeset data values for each main test cycle; and a plurality of tester channels, each tester channel for receiving the main and auxiliary test cycle data, each tester channel for receiving a separate one of said timeset values, each tester channel for receiving separate input selection control data selectively controlling whether the tester channel responds to said main test cycle data or to said auxiliary test cycle data, each tester channel, when responding to main test cycle data received at the beginning of a main test cycle, for carrying out a test activity at one of said DUT terminals once during said main test cycle, the test activity being timed in accordance with a combination of the received main test cycle data and the received timeset data, and wherein each tester channel, when responding to the auxiliary test cycle data received at the beginning of a main test cycle, for carrying out a test activity at one of said DUT terminals once during each of a plurality of auxiliary test cycles spanned by said main test cycle, the test activity being timed in accordance with a combination of the received auxiliary test cycle data and the received timeset data.

2. The tester in accordance with claim 1 wherein said pattern generator also generates period set data at the beginning of each main test cycle, the period set data indicating a length of the main test cycle, said main period generator determining therefrom the beginning time for a next main test cycle.

3. The tester in accordance with claim 1 wherein said period set data also indicates a length of each auxiliary cycle occurring during a next main test cycle, said auxiliary period generator determining therefrom a beginning time for each auxiliary test cycle spanned by a next main test cycle.

4. The tester in accordance with claim 1 wherein the main period generator comprises:
a first random access memory addressed by said period set data and reading out main period length data in response thereto, and
means responsive to said main period length data for generating said main test cycle data.

5. The tester in accordance with claim 4 wherein the auxiliary period generator comprises:
a second random access memory addressed by said period set data and reading out auxiliary period length data in response thereto, and
means responsive to said auxiliary period length data for generating said auxiliary test cycle data.

6. A tester for carrying out test activities at each terminal of an integrated circuit device under test (DUT) during successive main test cycles, each main test cycle spanning a plurality of auxiliary test cycles, the tester comprising:
a main period generator for generating main test cycle data indicating a beginning time of each main test cycle signal;
a plurality of auxiliary period generators, each for generating separate auxiliary test cycle data indicating a beginning time of an auxiliary test cycle,
a pattern generator for generating a plurality of timeset data values for each main test cycle; and
a plurality of tester channels,
each tester channel for receiving the main test cycle data and for receiving the auxiliary test cycle data produced by each auxiliary period generator,
each tester channel for receiving a separate one of said timeset values,
each tester channel also for receiving separate input selection control data selectively controlling whether the tester channel responds to said main test cycle data or to auxiliary test cycle data from one of said auxiliary period generators,
each tester channel, when responding to main test cycle data received at the beginning of a main test cycle, carrying out a test activity at one of said DUT terminals once during said main test cycle, the test activity being timed in accordance with a combination of the received main test cycle data and the received timeset data, and
each tester channel, when responding to auxiliary test cycle data received at the beginning of a main test cycle, carrying out a test activity at one of said DUT terminals once during each auxiliary test cycle spanned by said main test cycle, the test activity being timed in accordance with a combination of received auxiliary test cycle data from one of said auxiliary period generators and the received timeset data.

7. The tester in accordance with claim 6 wherein said pattern generator also generates period set data at the beginning of each main test cycle, the period set data indicating a length of the main test cycle, said main period generator determining therefrom the beginning time for a next main test cycle.

8. The tester in accordance with claim 6 wherein said period set data also indicates a length of each auxiliary cycle occurring during a next main test cycle, said auxiliary period generator determining therefrom a beginning time for each auxiliary test cycle spanned by a next main test cycle.

9. The tester in accordance with claim 6 wherein the main period generator comprises:
a first random access memory addressed by said period set data and reading out main period length data in response thereto, and
means responsive to said main period length data for generating said main test cycle data.

10. The tester in accordance with claim 9 wherein each auxiliary period generator comprises:
a second random access memory addressed by said period set data and reading out auxiliary period length data in response thereto, and
means responsive to said auxiliary period length data for generating said auxiliary test cycle data.

11. A tester for carrying out test activities at each terminal of an integrated circuit device under test (DUT) during successive main test cycles, each main test cycle spanning a plurality of auxiliary test cycles, the tester comprising:
a main period generator for generating main test cycle data indicating a beginning time of each main test cycle signal;
a pattern generator for generating a plurality of timeset data values for each main test cycle; and
a plurality of tester channels,
each tester channel receiving the main test cycle data produced by the main period generator,
each tester channel generating auxiliary test cycle data for each main test cycle, the auxiliary test cycle data indicating a beginning time of each auxiliary test cycle spanned by the main test cycle,
each tester channel receiving a separate one of said timeset values,
each tester channel also receiving separate input selection control data selectively controlling whether the tester channel responds to said main test cycle data or to its generated auxiliary test cycle data,
each tester channel, when responding to main test cycle data received at the beginning of a main test cycle, carrying out a test activity at one of said DUT terminals once during said main test cycle, the test activity being timed in accordance with a combination of the received main test cycle data and the received timeset data, and
each tester channel, when responding to its generated auxiliary test cycle data, carrying out a test activity at one of said DUT terminals once during each auxiliary test cycle spanned by a main test cycle, the test activity being timed in accordance with a combination of auxiliary test cycle data the received timeset data.

12. The tester in accordance with claim 11 wherein said pattern generator also generates period set data at the beginning of each main test cycle, the period set data indicating a length of the main test cycle, said main period generator determining therefrom the beginning time for a next main test cycle.

13. The tester in accordance with claim 6 wherein said period set data also indicates a length of each auxiliary cycle occurring during a next main test cycle, said auxiliary period generator determining therefrom a beginning time for each auxiliary test cycle spanned by a next main test cycle.

14. The tester in accordance with claim 11 wherein the main period generator comprises:

a first random access memory addressed by said period set data and reading out main period length data in response thereto, and means responsive to said main period length data for generating said main test cycle data.

15. The tester in accordance with claim 14 wherein said auxiliary period generator comprises:

a second random access memory addressed by said period set data and reading out auxiliary period length data in response thereto, and means responsive to said auxiliary period length data for generating said auxiliary test cycle data.

* * * * *

UNITED STATES PATENT AND TRADEMARK OFFICE
CERTIFICATE OF CORRECTION

PATENT NO. : 5,917,834
DATED : June 29, 1999
INVENTOR(S) : Brian J. ARKIN

It is certified that error appears in the above-identified patent and that said Letters Patent is hereby corrected as shown below:

Column 10, line 66 (Claim 1, line 30), "wherein" should be deleted.

Signed and Sealed this

Twenty-third Day of November, 1999

Attest:

Q. TODD DICKINSON

Attesting Officer

Acting Commissioner of Patents and Trademarks